US006873065B2

(12) United States Patent
Haigh et al.

(10) Patent No.: US 6,873,065 B2
(45) Date of Patent: Mar. 29, 2005

(54) NON-OPTICAL SIGNAL ISOLATOR

(75) Inventors: Geoffrey T. Haigh, Boxford, MA (US); Baoxing Chen, Chelmsford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/838,520

(22) Filed: Apr. 19, 2001

(65) Prior Publication Data

US 2002/0135236 A1 Sep. 26, 2002

Related U.S. Application Data (63) Continuation-in-part of application No. 09/557,542, filed on Apr. 25, 2000, now Pat. No. 6,291,907, which is a continuation of application No. 09/118,032, filed on Jul. 17, 1998, now Pat. No. 6,054,780.
(60) Provisional application No. 60/063,221, filed on Oct. 23, 1997.

(51) Int. Cl.[7] .............................................. H02F 27/42
(52) U.S. Cl. ........................ 307/412; 307/89; 257/531
(58) Field of Search ........................... 307/91, 412, 89; 257/531

(56) References Cited

U.S. PATENT DOCUMENTS

| 3,537,022 A | 10/1970 | Regan |
| 3,714,540 A | 1/1973 | Galloway |
| 3,798,608 A | 3/1974 | Huebner |

(Continued)

FOREIGN PATENT DOCUMENTS

| DE | 25 29 296 | 1/1977 |
| DE | 19718420 A1 | 11/1998 |
| DE | 19922129 C1 | 9/2000 |
| DE | 19922123 A1 | 11/2000 |
| DE | 19922127 A1 | 11/2000 |
| DE | 19922128 C1 | 1/2001 |
| DE | 19922127 C2 | 5/2002 |
| EP | 0 282 102 | 9/1988 |
| EP | 0586062 A | 9/1994 |
| FR | 2 679 670 | 7/1999 |
| JP | 58215833 A | 3/1984 |
| WO | 0586062 A1 | 7/1993 |
| WO | WO 95/20768 | 3/1995 |
| WO | 98/37672 | 8/1998 |
| WO | WO 98/37672 | 8/1998 |
| WO | WO 99/21332 | 4/1999 |
| WO | WO 01/61951 | 8/2001 |
| WO | WO 2002/086969 | 10/2002 |

OTHER PUBLICATIONS

Burr–Brown, "Dual, Isolated, Bi–Directional Digital Coupler," 2000, ISO150.
International Search Report, A0312/7343 WO, mailed Apr. 1, 1999.
International Search Report, A00312/70393 WO, mailed Aug. 28, 2003.

(Continued)

Primary Examiner—Robert L. DeBeradinis
(74) Attorney, Agent, or Firm—Iandiorio & Teska (57) ABSTRACT

A non-optical isolator having a driver circuit for providing an input signal to one or more first passive components which are coupled across a galvanic isolation barrier to one or more corresponding second passive components, and an output circuit that converts the signal from the second passive components to an output signal corresponding to the input signal. The entire structure may be formed monolithically as an integrated circuit on one or two die substrates, for low cost, small size, and low power consumption. The passive components may be coils or capacitor plates, for example. When the first and second passive components are capacitor plates, a Faraday shield may be provided between them, with the first and second passive components being referenced to separate grounds and the Faraday shield referenced to the same ground as the second passive components.

14 Claims, 8 Drawing Sheets

U.S. PATENT DOCUMENTS

| | | | |
|---|---|---|---|
| 4,027,152 A | | 5/1977 | Brown et al. |
| 4,118,603 A | | 10/1978 | Kumhyr |
| 4,227,045 A | | 10/1980 | Chelcun et al. |
| 4,302,807 A | | 11/1981 | Mentler |
| 4,660,014 A | * | 4/1987 | Wenaas et al. ............ 336/84 C |
| 4,748,419 A | | 5/1988 | Somerville |
| 4,780,795 A | * | 10/1988 | Meinel ....................... 361/765 |
| 4,817,865 A | | 4/1989 | Wray ........................ 236/49.5 |
| 4,818,855 A | | 4/1989 | Mongeon et al. |
| 4,825,450 A | | 4/1989 | Herzog |
| 4,835,486 A | | 5/1989 | Somerville |
| 4,859,877 A | | 8/1989 | Cooperman et al. |
| 4,885,582 A | | 12/1989 | LaBarge et al. |
| 4,922,883 A | * | 5/1990 | Iwasaki ....................... 123/598 |
| 4,945,264 A | | 7/1990 | Lee et al. |
| 5,041,780 A | | 8/1991 | Rippel |
| 5,057,968 A | | 10/1991 | Morrison .................... 361/385 |
| 5,102,040 A | | 4/1992 | Harvey ...................... 236/49.3 |
| 5,142,432 A | | 8/1992 | Schneider ................... 361/91 |
| 5,204,551 A | | 4/1993 | Bjornholt |
| 5,270,882 A | | 12/1993 | Jove et al. |
| 5,384,808 A | | 1/1995 | Van Brunt et al. |
| 5,396,394 A | | 3/1995 | Gee |
| 5,467,607 A | | 11/1995 | Harvey ........................ 62/186 |
| 5,484,012 A | | 1/1996 | Hiratsuka .................... 165/40 |
| 5,533,054 A | | 7/1996 | DeAndrea et al. |
| 5,539,598 A | | 7/1996 | Denison et al. |
| 5,588,021 A | | 12/1996 | Hunt et al. |
| 5,596,466 A | | 1/1997 | Ochi |
| 5,701,037 A | | 12/1997 | Weber et al. |
| 5,714,938 A | | 2/1998 | Schwabl ..................... 340/584 |
| 5,731,954 A | | 3/1998 | Cheon ........................ 361/699 |
| 5,781,071 A | * | 7/1998 | Kusunoki .................... 330/269 |
| 5,786,979 A | * | 7/1998 | Douglass ..................... 361/328 |
| 5,831,426 A | | 11/1998 | Black, Jr. et al. ........... 324/127 |
| 5,831,525 A | | 11/1998 | Harvey |
| 5,952,849 A | | 9/1999 | Haigh |
| 5,969,590 A | * | 10/1999 | Gutierrez .................... 336/200 |
| 6,054,780 A | | 4/2000 | Haigh et al. |
| 6,087,882 A | * | 7/2000 | Chen et al. ................. 327/333 |
| 6,104,003 A | | 8/2000 | Jones ......................... 219/400 |
| 6,124,756 A | | 9/2000 | Yaklin et al. |
| 6,262,600 B1 | | 7/2001 | Haigh et al. |
| 6,291,907 B1 | | 9/2001 | Haigh et al. |
| 6,525,566 B2 | | 2/2003 | Haigh |

OTHER PUBLICATIONS

Burr–Brown, "Dual, Isolated, Bi–Directional Digital Coupler", 1993, ISO150.

International Search Report, 029.55.251, mailed May 22, 1998.

International Search Report, 02955.753, mailed Jun. 5, 2001.

* cited by examiner

NON-OPTICAL SIGNAL ISOLATOR

CROSS-REFERENCE TO RELATED APPLICATIONS

This application is a continuation-in-part of Ser. No. 09/557,542, filed Apr. 25, 2000 now U.S. Pat. No. 6,291,907, which is a continuation of Ser. No. 09/118,032, filed Jul. 17, 1998, now U.S. Pat. No. 6,054,780, which claims priority from provisional application No. 60/063,221 filed Oct. 23, 1997. These priority documents are expressly incorporated by reference for all purposes.

FIELD OF THE INVENTION

This invention relates to circuitry and structures for isolating electronic signals, such as signals in a process control system, or between microcontrollers and other signal sources and transducers or other devices using those signals.

BACKGROUND OF THE INVENTION

In a variety of environments, such as in process control systems, analog or digital signals must be transmitted between diverse sources and circuitry using those signals, while maintaining electrical (i.e., galvanic) isolation between the sources and the using circuitry. Isolation may be needed, for example, between analog sensors and amplifiers or other circuits which process their output, or between microcontrollers, on the one hand, and sensors or transducers which generate or use microcontroller input or output signals, on the other hand. Electrical isolation is intended, inter alia, to prevent extraneous transient signals, including common-mode transients, from inadvertently being processed as status or control information, or to protect equipment from shock hazards or to permit the equipment on each side of an isolation barrier to be operated at a different supply voltage, among other known objectives. One well-known method for achieving such isolation is to use optical isolators that convert input electrical signals to light levels or pulses generated by light emitting diodes (LEDs), and then to receive and convert the light signals back into electrical signals. Optical isolators present certain limitations, however: among other limitations, they are rather non-linear and not suitable for accurate linear applications, they require significant space on a card or circuit board, they draw a large current, they do not operate well at high frequencies, and they are very inefficient. They also provide somewhat limited levels of isolation. To achieve greater isolation, opto-electronic isolators have been made with some attempts at providing an electrostatic shield between the optical transmitter and the optical receiver. However, a conductive shield which provides a significant degree of isolation is not sufficiently transparent for use in this application.

One isolation amplifier avoiding the use of such optical couplers is U.S. Pat. No. 5,831,426 to Black et al, which shows a current determiner having an output at which representations of input currents are provided, having an input conductor for the input current and a current sensor supported on a substrate electrically isolated from one another but with the sensor positioned in the magnetic fields arising about the input conductor due to any input currents. The sensor extends along the substrate in a direction primarily perpendicular to the extent of the input conductor and is formed of at least a pair of thin-film ferromagnetic layers separated by a non-magnetic conductive layer. The sensor can be electrically connected to a electronic circuitry formed in the substrate including a nonlinearity adaptation circuit to provide representations of the input currents of increased accuracy despite nonlinearities in the current sensor, and can include further current sensors in bridge circuits. Another non-optical isolation amplifier, for use in a digital signaling environment, is described in U.S. Pat. No. 4,748,419 to Somerville. In that patent, an input data signal is differentiated to create a pair of differential signals that are each transmitted across high voltage capacitors to create differentiated spike signals for the differential input pair. Circuitry on the other side of the capacitive barrier has a differential amplifier, a pair of converters for comparing the amplified signal against high and low thresholds, and a set/reset flip-flop to restore the spikes created by the capacitors into a logic signal. In such a capacitively-coupled device, however, during a common mode transient event, the capacitors couple high, common-mode energy into the receiving circuit. As the rate of voltage change increases in that common-mode event, the current injected into the receiver increases. This current potentially can damage the receiving circuit and can trigger a faulty detection. Such capacitively coupled circuitry thus couples signals that should be rejected. The patent also mentions, without elaboration, that a transformer with a short R/L time constant can provide an isolation barrier, but such a differential approach is nonetheless undesirable because any mismatch in the non-magnetic (i.e., capacitive) coupling of the windings would cause a common-mode signal to appear as a difference signal.

Another logic isolator which avoids use of optical coupling is shown in commonly-owned U.S. Pat. No. 5,952,849, incorporated by reference herein. This logic isolator exhibits high transient immunity for isolating digital logic signals, such as signals between equipment on a field side (i.e., interfacing with physical elements which measure or control processes) and microcontrollers on a system control side, useful in, for example, a process control system.

SUMMARY OF THE INVENTION

As used herein, the interchangeable terms "Isolation," "signal Isolation" and "information signal isolator" include circuits and devices providing for the isolated transmission of analog or digital electronic signals, such as control, power, or information signals, from an input to a galvanically isolated output.

The present invention includes a non-optical isolator (i.e., an isolator wherein the isolation barrier is not optical in nature). An input signal is coupled from an input node to a non-optical field generator and the field generated thereby is coupled to one or more corresponding field-receiving elements one of whose properties or conditions is variable in response to the generated (and applied) field. An output circuit coupled to the field-receiving elements converts the variations to an output signal corresponding to the input signal. The field may be an electrical or a magnetic field and the elements may be MR or GMR elements or inductors or portions of capacitors. When the elements are capacitors, a Faraday shield preferably is interposed between the field generator(s) and the corresponding elements. (Hereafter, the term MR will be used generically, except where otherwise noted from context, to include both magneto-resistive and giant magneto-resistive elements.) The input signal is referenced to a first ground, or reference potential, and the output signal is referenced to a second ground, or reference potential. The Faraday shield also is referenced to the second ground. Common mode transients are capacitively coupled from the field generator(s) into the Faraday shield and therethrough to the second ground, instead of into the corresponding field-receiving elements. The magnetic-field generator may include one or more coils and a driving circuit coupled between the input node and the coil or coils.

According to an aspect of the invention, the fields generated may be magnetic fields, the field-generating elements may be coils and the corresponding field-receiving elements may be MR elements. Further, two Faraday shields may be disposed in spaced relationship between the coil(s) and the MR elements. In such an arrangement, a first Faraday shield is at the first reference potential and a second Faraday shield is at the second reference potential.

According to certain aspects of the invention, when the field-receiving elements are MR elements they may comprise four magnetically-sensitive resistor elements arranged in a bridge, with diagonally opposing pairs of such resistors receiving the magnetic field from each of first and second input coils, respectively. The output nodes of the bridge are connected to differential inputs of a differential receiver.

According to another aspect, the receiving elements may be coil windings instead of MR elements.

According to still another aspect, the field-generating and field-receiving elements may be plates of one or more capacitors.

The isolation barrier may be formed on one or two silicon die and can be formed from other passive elements such as two pairs of capacitor plates, or two pairs of (coil) windings, in each case preferably creating a vertical structural arrangement with a dielectric (and in the case of windings, a Faraday shield) between the passive elements.

In one aspect, an isolator according to the invention may be monolithically fabricated. Either one die or two may be used. Using the example of a coil-MR arrangement, with two die, the driver circuitry may, for example, be formed on a first substrate and the coil(s), MR element(s) and receiver may be formed on a second substrate. An embodiment is shown with a complete isolator formed monolithically on a single die.

With appropriate driver and receiver circuits, some embodiments of the isolator are useful for either analog signals or digital signals. Exemplary driver and receiver circuits for each type of signal are shown.

These structures thus have first and second passive components isolated from third and fourth passive components. The first and second components may be coils with the third and fourth components coils or MR elements, or the components all may be capacitor plates. These structures are made with first and second passive components on the substrate, an insulating layer over the first and second passive components, and third and fourth passive components on the insulating layer. Desirably, there is a Faraday shield between the first and second passive components (when they are coil windings), on the one hand, and the third and fourth passive components, on the other, with the first and second passive components referenced to a first electrical ground and the third and fourth passive components referenced to a different, galvanically isolated, second ground, the Faraday shield also being connected to said second ground. An input node through which an input signal is supplied to drive the first and second passive components is referenced to the first ground and an output node through which an output signal is obtained from the third and fourth passive components is referenced to the second ground.

The foregoing and other features, advantages and alternative embodiments of the invention, will be more readily understood and become apparent from the detail description which follows, which should be read in conjunction with the accompanying drawings and claims. The detailed description will be understood to be exemplary only and is not intended to be limited of the invention.

DETAILED DESCRIPTION

Figure 1:
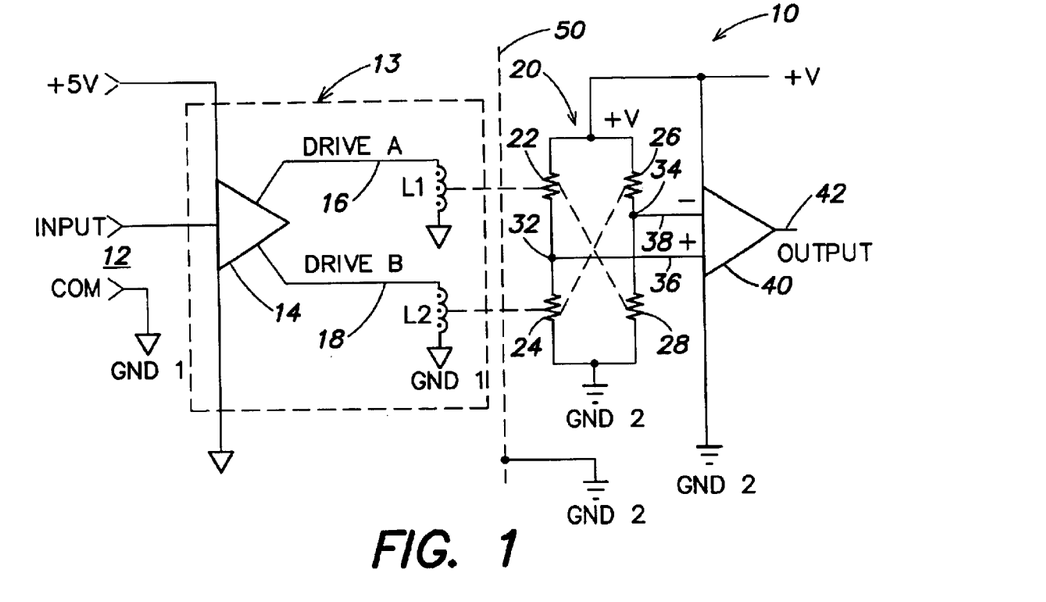
FIG. 1 is a schematic circuit diagram for a first exemplary implementation of a non-optical isolator.

An exemplary implementation of an isolator 10 using coil-type field-generating and MR receiving elements in accordance with the present invention is illustrated schematically in FIG. 1. An input voltage is supplied at port 12 to a magnetic field generator 13, comprising an input driver 14 and one or more coils L1, L2. Driver 14 supplies output signals DRIVE A and DRIVE B on lines 16 and 18, respectively, to respective coils LI and L2. Each of coils L1 and L2 generates a magnetic field which is sensed by a bridge 20 formed by MR elements 22, 24, 26 and 28. Elements 22 and 24 are connected in series across the supply rails as are elements 26 and 28. The bridge provides a differential output across nodes 32 and 34 at the respective junctions between resistors 22 and 24 on the one hand, and 26 and 28 on the other. Node 32 supplies a first signal RCVDC on line 36 to a non-inverting input of a differential receiver 40 and node 34 supplies a second received signal RCVDD on line 38 to the inverting input of the receiver 40. The output of the isolator appears on line 42 at the output of receiver 40. Since galvanic isolation of the output from the input is a principal objective, the input is referenced to a first ground, GND 1, and the output is referenced to a second ground, GND2. A Faraday shield, connected to ground GND2, is interposed between the coils L1, L2, on the one hand, and bridge 20, on the other. Faraday shield 50 provides electrostatic isolation between the coils and the MR bridge while allowing the magnetic fields generated by the coils to pass through to the MR elements of the bridge. Specifically, the field generated by coil L1 passes through elements 22 and 28 while the field generated by coil L2 passes through the elements 24 and 26.

For use as an analog signal isolator, the driver 14 may typically provide signals DRIVEA and DRIVEB as a pair of differential output signals. Some wave-shaping or signal conditioning may be applied in driver 14 or in receiver 40, as appropriate to the applications.

Figure 2:
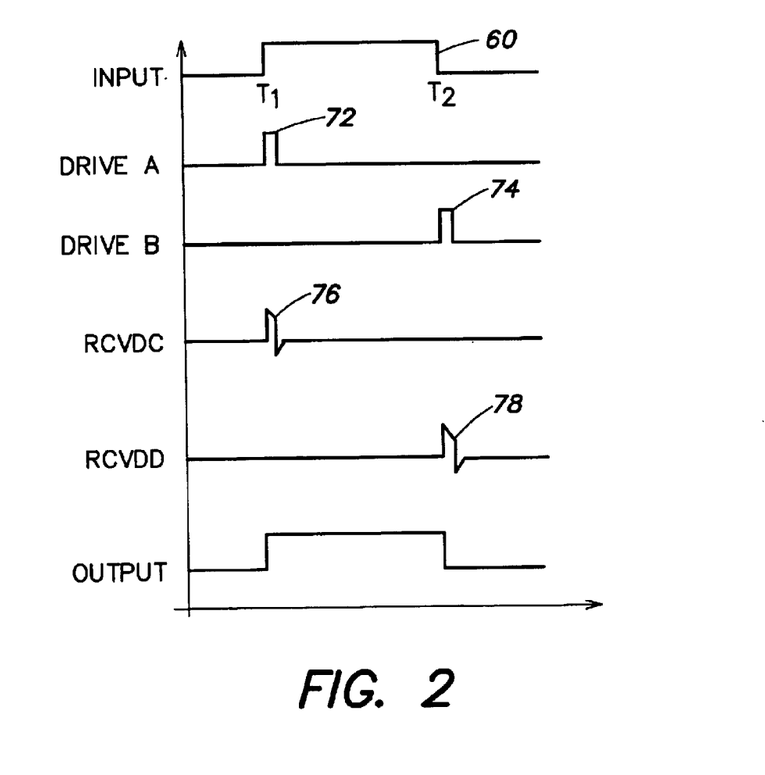
FIG. 2 is a waveform diagram illustrating operation of the circuit of FIG. 1 as a digital signal isolator.

For use as a digital signal isolator, operation of isolator 10 circuit may be understood with reference to the waveforms of FIG. 2. In FIG. 2, it is assumed that the input signal is a voltage having a waveform representing a logic signal illustrated at 60. Prior to time T1, signal 60 is low. At time TI, the input goes from a low to a high value and driver 14 presents a pulse 72 of a short, predetermined width and amplitude in the signal DRIVEA. At the falling edge of the input signal, at time T2, a comparable pulse 74 is generated by driver 14 in the signal DRIVEB. The corresponding received signals detected at nodes 32 and 34 are shown in the waveforms for the signals RCVDC and RCVDD. Receiver 40 is a comparator with a slight amount of hysteresis, which essentially operates as a bistable element. The "pulse" 76 generated in the RCVDC signal by DRIVEA pulse 72 sets the output signal high, and the pulse 78 generated in the RCVDD signal generated by the DRIVEB pulse 74 resets the output signal to a low level. Thus, the output signal recreates the input signal faithfully.

The amount of hysteresis employed in receiver 40 preferably is selected to assure a high reliability of set and reset operation of the receiver while obtaining as much insensitivity to noise as possible.

Figure 3:
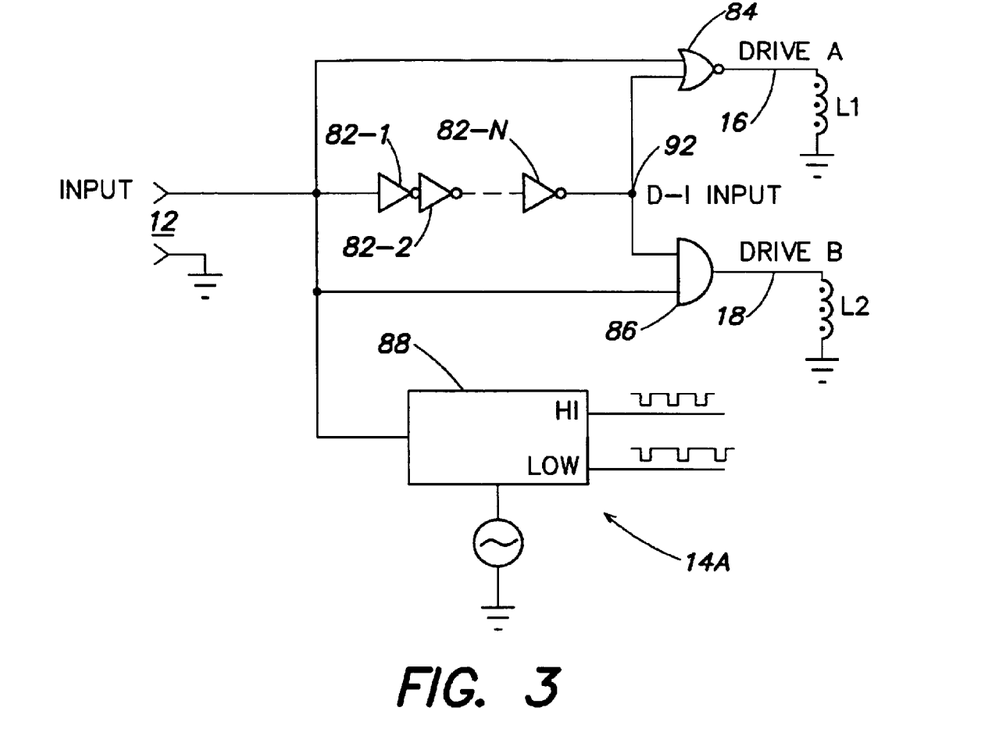
FIG. 3 is a logic diagram for a driver circuit suitable for use in the digital isolator of FIG. 2.

While numerous circuits may be employed for driver 14 in the digital signal processing mode, an exemplary circuit 14A is shown in FIG. 3. The input signal applied to port 12 is supplied to an odd number of inverters 82-1 through 82-N (three inverters may suffice), as well as to one input of each of NOR-gate 84 and AND gate 86, as well as to pulse generator 88. (Pulse generator 88 is optional and its use is described in the incorporated patent. A second input of each of gates 84 and 86 is supplied from the output of the inverter string 82-1 through 82-N. The output of NOR-gate 84 supplies the DRIVEA signal on line 16 to coil L1 and the output of AND GATE 86 supplies the DRIVEB signal on line 18 to coil L2.

Figure 4:
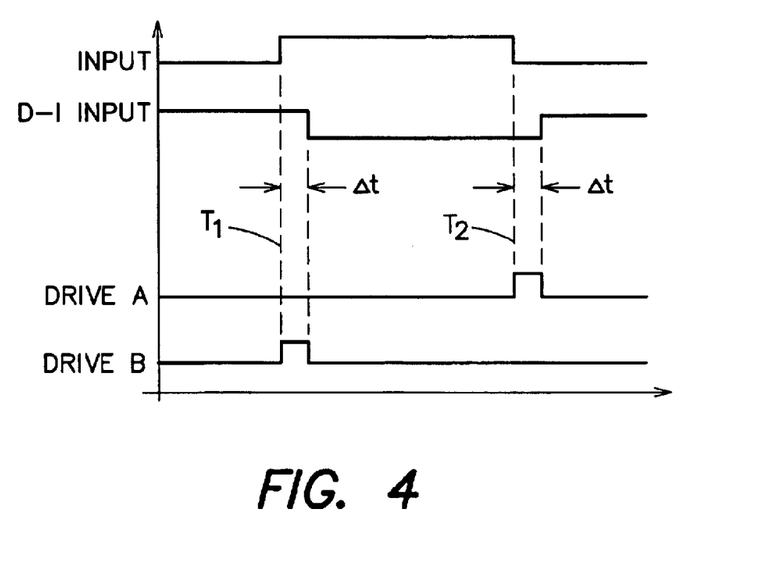
FIG. 4 is a waveform diagram illustrating operation of the circuit of FIG. 3.

The operation of the circuit of FIG. 3 is now explained with reference to the waveforms of FIG. 4. The input signal again is assumed to be a logic signal which is high between times T1 and T2. The delayed and inverted state of the input signal which appears at node 92, termed D-I INPUT, thus is a copy of the input signal, inverted and delayed by the propagation delay of the inverter chain 82-1 through 82-N, which delay is labeled in the drawing as Δt. It is assumed that At is much smaller than the interval from T1 through T2. For example, Δt is typically just a few nanoseconds. The output from NOR-gate 84 consequently is high except during interval from T2 to T2+Δt; and the output of the AND gate 86, the DRIVEB signal, is high except in the interval from T1 to T1+Δt.

Figure 5:
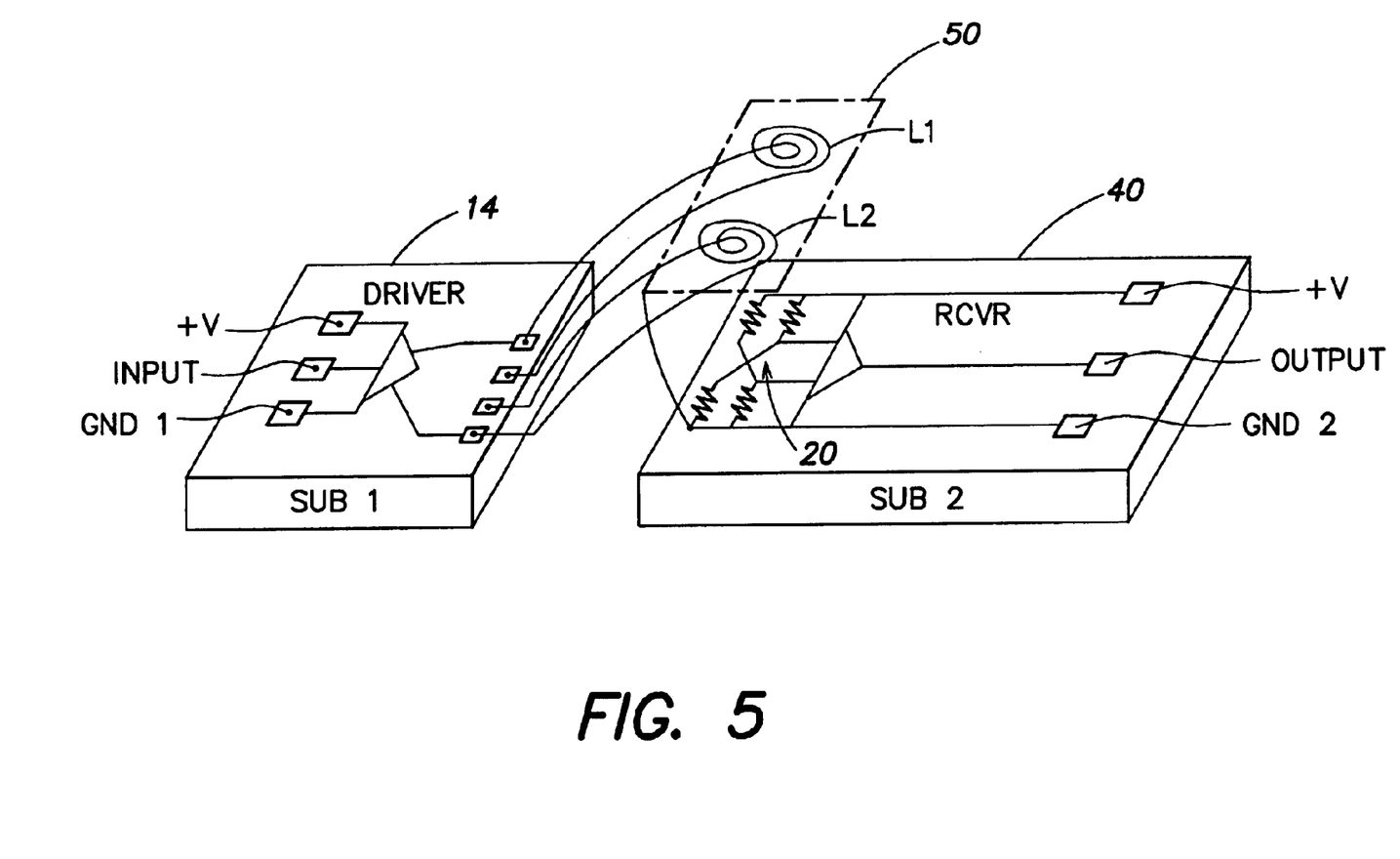
FIGS. 5, 9, and 10 are diagrammatic, exploded views showing conceptually how an isolator according to the present invention may be fabricated using integrated circuit manufacturing techniques, with MR elements receiving a magnetic field in FIG. 5, an electric field generator in FIG. 9, sensed by a capacitive output, and a magnetic field detected by coils in FIG. 10.

A diagrammatic illustration, as shown in FIG. 5, is useful to illustrate conceptually how such an isolator may be fabricated monolithically. Such fabrication may occur with the driver on a first substrate, SUB 1, and with the coils, Faraday shield, MR sensor and receiver on a second substrate, SUB 2, or with the entire apparatus on a single substrate (i.e., where SUB 1 and SUB 2 are the same substrate), as more filly explained below.

Figure 6:
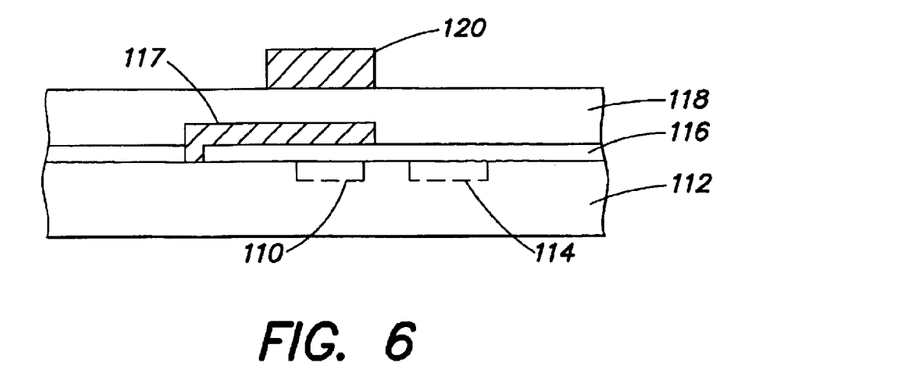
FIG. 6 illustrates in a simplified side view, schematically, the layers of materials that form monolithically the elements of an isolator according to the present invention.

Without indicating any patterning, FIG. 6 shows a schematic side view of the layers of materials that form monolithically the coils, Faraday shield, sensor and receiver of FIG. 5. The resistive sensors 110 are formed on or in a semiconductor substrate 112 along with the receiver circuitry indicated generally in area 114. A thin layer of oxide 116 is then formed over the substrate. This is followed by a metallization layer 117 which connects to the substrate (i.e., the input's ground) and which provides the Faraday shield; appropriate positioning and area considerations are discussed below). A thick oxide layer 118 is applied over the metallization. On top of the thick oxide layer 118 there is formed a metallization layer 120 which is patterned to form coil L1 and L2 in appropriate geometric relationship and placement over sensor elements 110.

Figure 7:
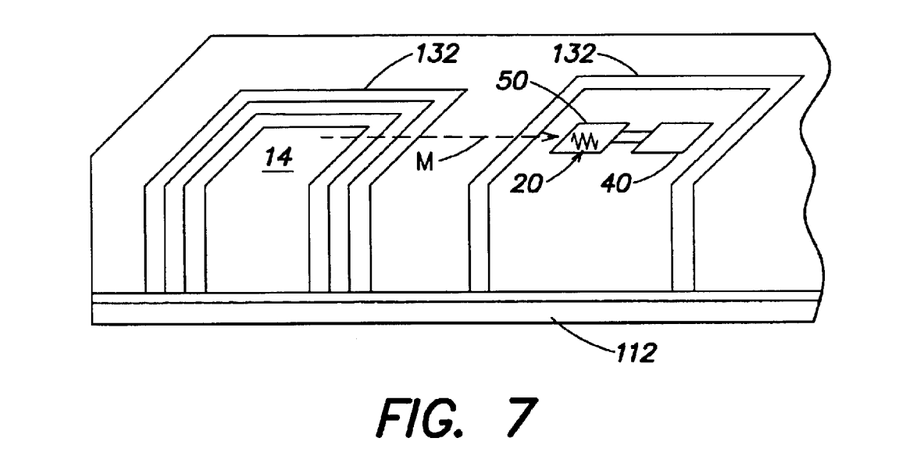
FIG. 7 is a simplified diagrammatic, isometric view, partially in cross section, showing how a complete isolator according to the present invention, with an input driver circuit, may be fabricated monolithically on a single substrate.

Turning to FIG. 7 there is generally illustrated a single substrate embodiment containing the entire isolator. The driver circuitry 14 is electrically isolated from the sensors 20 and receiving circuitry 40 by building the entire isolator structure on an oxide layer formed over the substrate 112 and then surrounding the driver and/or sensors and receiver by one or more dielectric isolation zones, also called trenches, 132 which are filled during fabrication with an oxide or other dielectric material. To avoid obfuscation, the coils are not drawn but are represented operatively by the dashed line M, representing a magnetic linking.

Using a trench-isolated IC manufacturing process, approximately one kilovolt of isolation is provided per micrometer of oxide (or nitride or similar dielectric) thickness. With a base oxide layer and trenches three micrometers thick, approximately three kilovolts of isolation will be achieved. This is satisfactory for a large number of typical applications and it can be increased for other applications.

Figure 8:
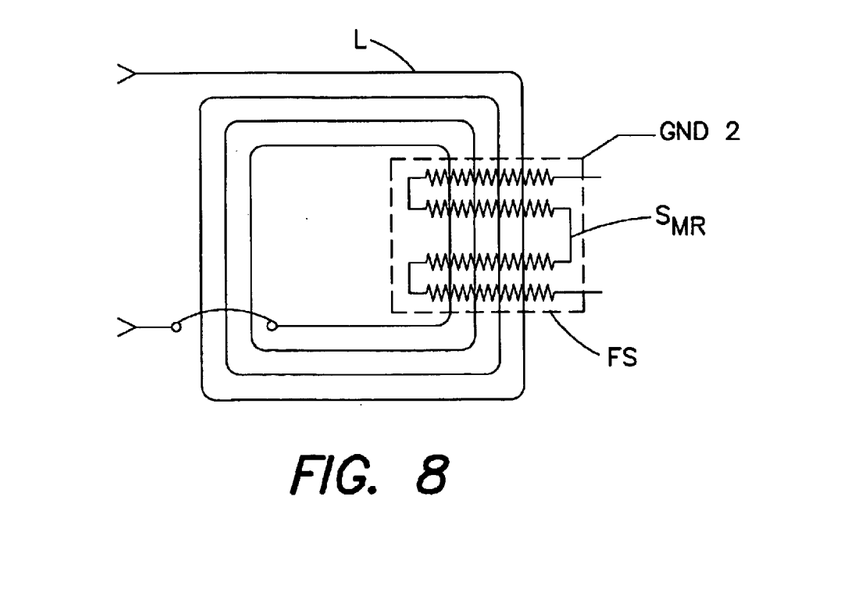
FIG. 8 is a simplified top view of a portion of an exemplary isolator according to the invention, showing the spatial relationship among the magnetic-field generating coil(s), a Faraday shield and magnetoresisitive sensor elements.

A top view, in diagrammatic form, of an exemplary geometry for a single coil-shield-sensor arrangement is shown in FIG. 8. The Faraday shield FS which is interposed between the coil L and the sensor $S_{MR}$ is a highly conductive surface, such as a metal, which does not form a closed loop of high permeability "short circuiting" the magnetic field. Thus, a metal patch area over the sensor is sufficient, where the surface area of the metal patch does not span the whole coil. The orientation of the sensor resistors relative to the coil may be significant. MR and GMR resistors generally change their resistance in response to the applied magnetic field when the magnetic field lines are oriented longitudinally with the resistor. Thus, in the illustration, the MR resistors of sensor $S_{MR}$ are shown oriented horizontally while the coil windings are substantially vertical where they span the sensor.

A typical opto-isolator draws a steady current of about 3–15 mA for high speed digital operation, using a supply voltage in the three to five volt range. By contrast, the exemplary apparatus of FIG. 2 et seq. draws very little current except during the drive pulses. With a 50 MHz clock speed, and a pulse width, Δt, of one nanosecond, if the current drawn during the pulse is 10 mA, the average current is only 0.5 mA. At low clock speeds or data rates such as a 50 Hz rate as might be used in medical electronics, for example, the drive pulses consume an average current of only about 0.5 microamps. Even considering the current required for operating the receiver and quiescent driver circuits, the entire apparatus may be operated on only about 10–12 microamps. Additionally, magnetoresistive elements are very fast to respond to changes in magnetic field, reacting in the nanosecond domain. As a result, an isolator in accordance with the invention should be much faster (e.g., ten times faster) than an opto-isolator.

For GMR elements, the change in resistance over the range of magnetic field from a zero field to a saturation field is only about 1–4 percent. When a five volt power supply is used, this means the GMR elements produce only about a 50–200 millivolt signal swing. The capacitive coupling between the coils and the GMR elements may be about 0.1–1 pF without the Faraday shield. If a transient common mode voltage is imposed on driver 14, it is capacitively coupled from the output of drive 14 into Faraday shield 50, and the capacitive current is coupled to ground.

Numerous design considerations must be taken into account when assembling such an isolator, in addition to those already discussed. These are easily within the skill of circuit design and semiconductor engineers. For example, the MR elements must be placed relative to the magnetic field provided by the coils so as, preferably, to have the magnetic field direction coincide substantially with the sensors' lengthwise, most-sensitive, direction. The MR elements will thus generate the greatest output for a given magnetic field if they (the MR elements) are all similarly oriented relative to the magnetic field. A useful arrangement, as depicted in top view in FIG. 8 is to form the coils as about six substantially rectangular turns of conductor, forming an inductance of about 1 nH, disposing the magneto-resistive elements under one side of the rectangle, with their magnetically-sensitive direction being transverse to the rectangle's side. (With such a small inductance, it is important that the driver circuit act as a very good current source.) The Faraday shield should be large enough to span the MR elements but not so large as to have it interfere significantly with the magnetic field from the coils cutting through the MR elements.

Figure 9:
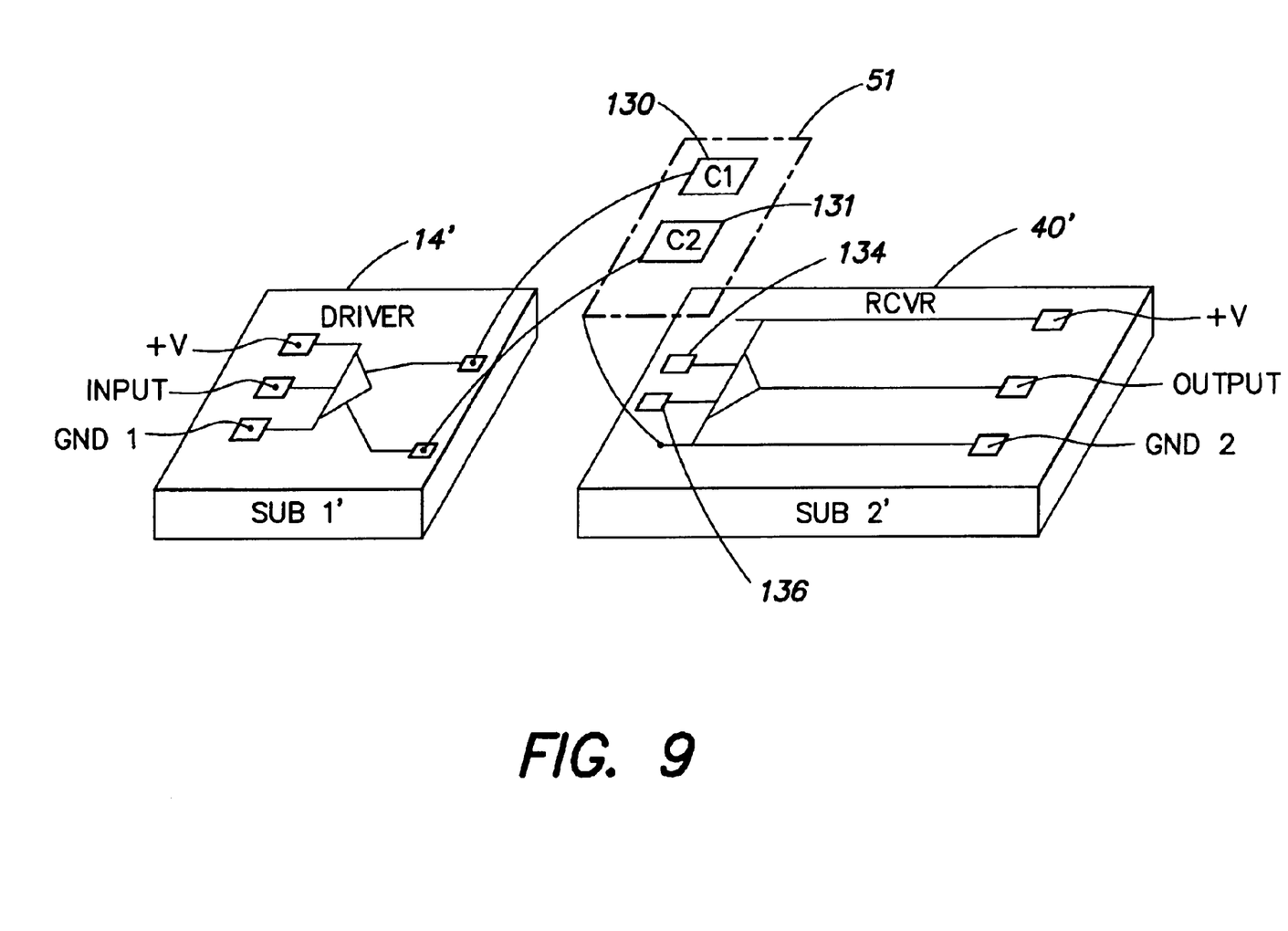
Figure 10:
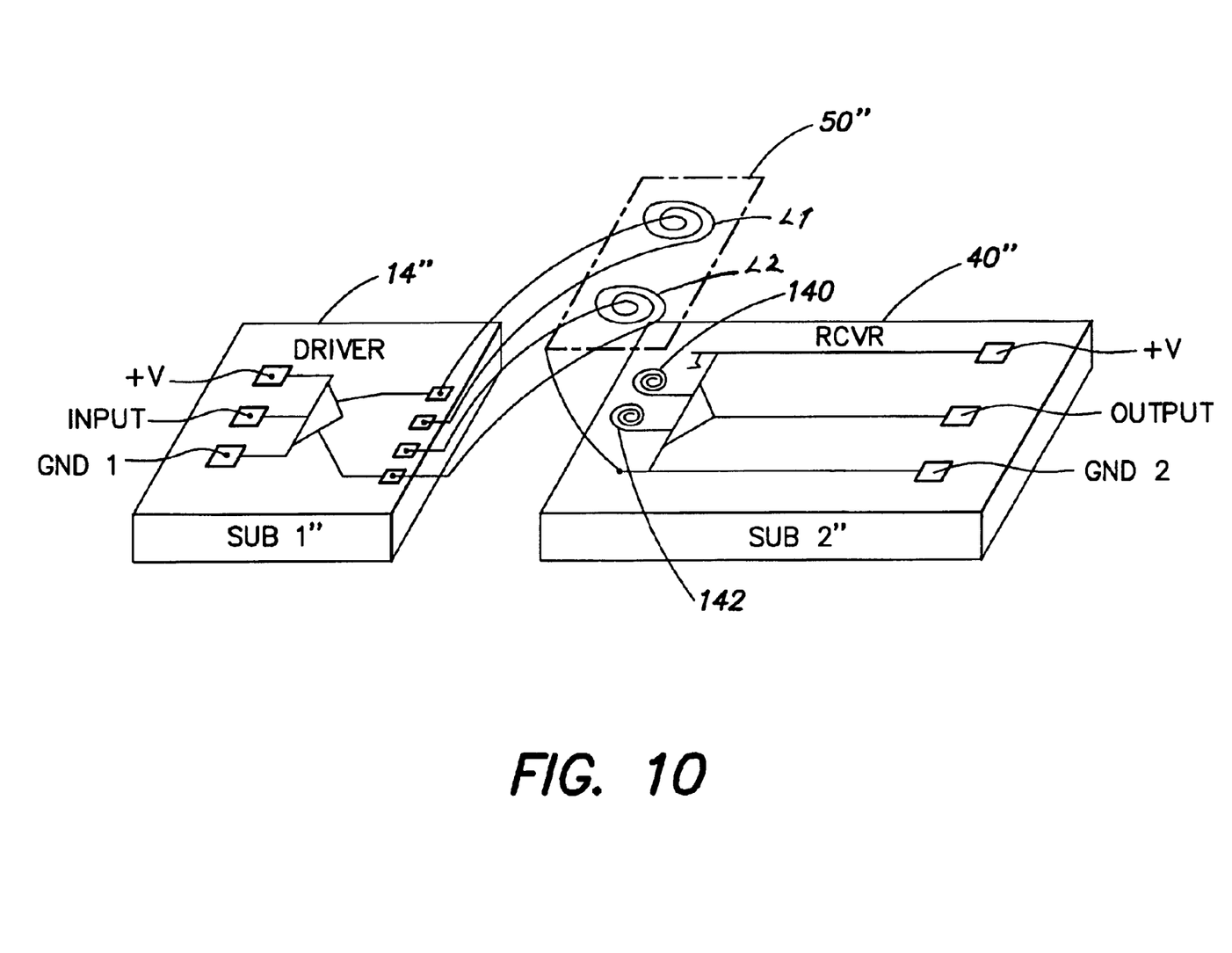

FIG. 9 shows isolators that are similar in certain fabrication aspects to the isolator shown in FIG. 5, except that in FIG. 9, the inductors and GMR have been each replaced by two sets of capacitor plates, and in FIG. 10, the GMR has been replaced by a second set of coils. In the case of FIG. 9, driver 14' provides first and second signals to top plates 130 and 131 of capacitors C1 and C2. These capacitors are formed on a dielectric layer 51 that separates top plates 130 and 131 from respective lower plates 134 and 136. The plates and dielectric layer can be formed using standard semiconductor processing techniques. The resulting device, while shown on two separate silicon substrates, could be provided on a single silicon substrate.

Referring to FIG. 10, the GMR is replaced by coils 140 and 142 to provide coil-to-coil coupling. The top coils can be separated from the respective bottom coils with dielectric layers and a shield 50".

The driver and receiver circuitry which is used should be selected with the application for the isolator and with the characteristics of the selected passive components in mind.

Figure 11:
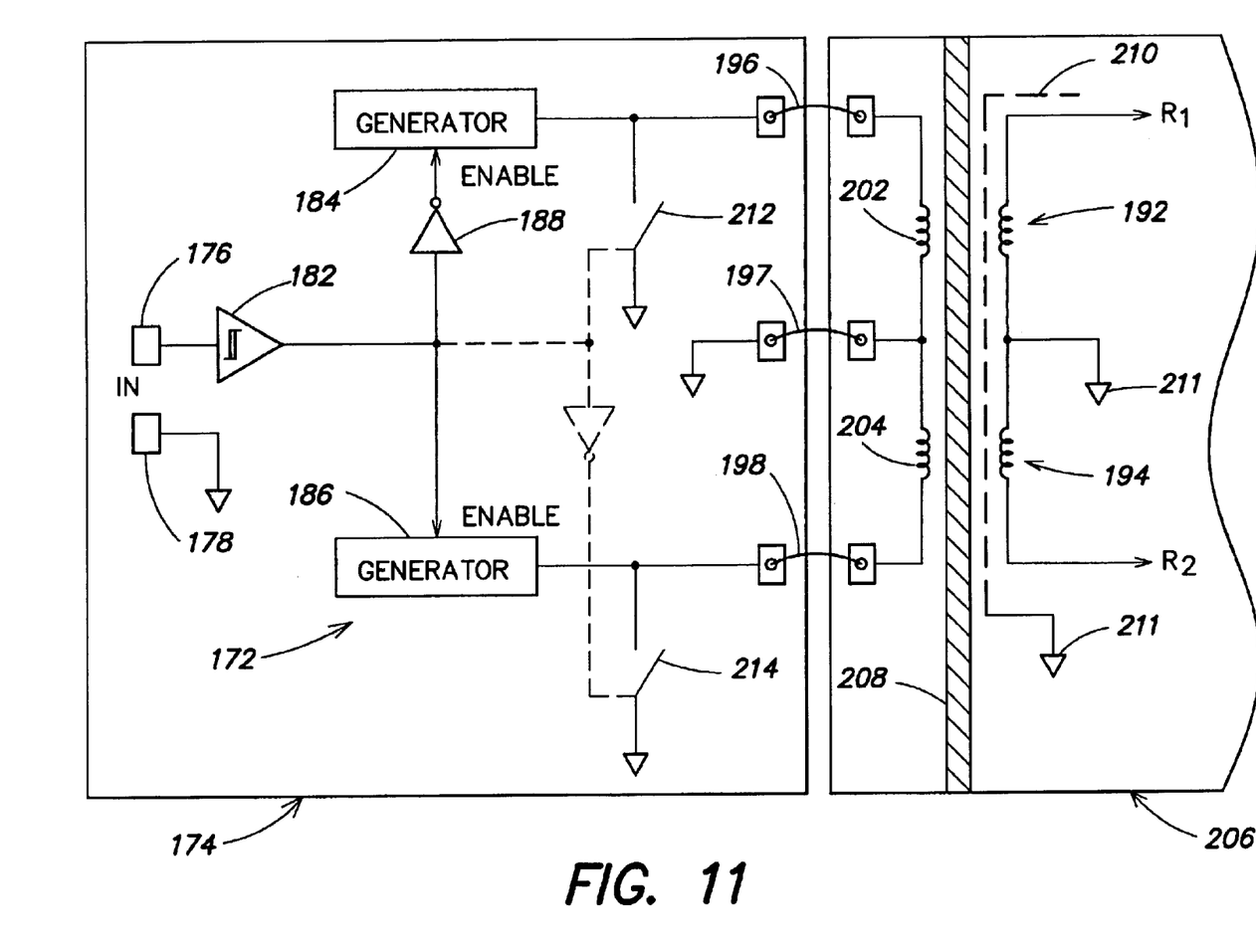
FIGS. 11 and 12 are combination block/schematic/diagrammatic illustrations showing an alternative implementation for a coil—coil version of an isolator according to the invention.
Figure 12:
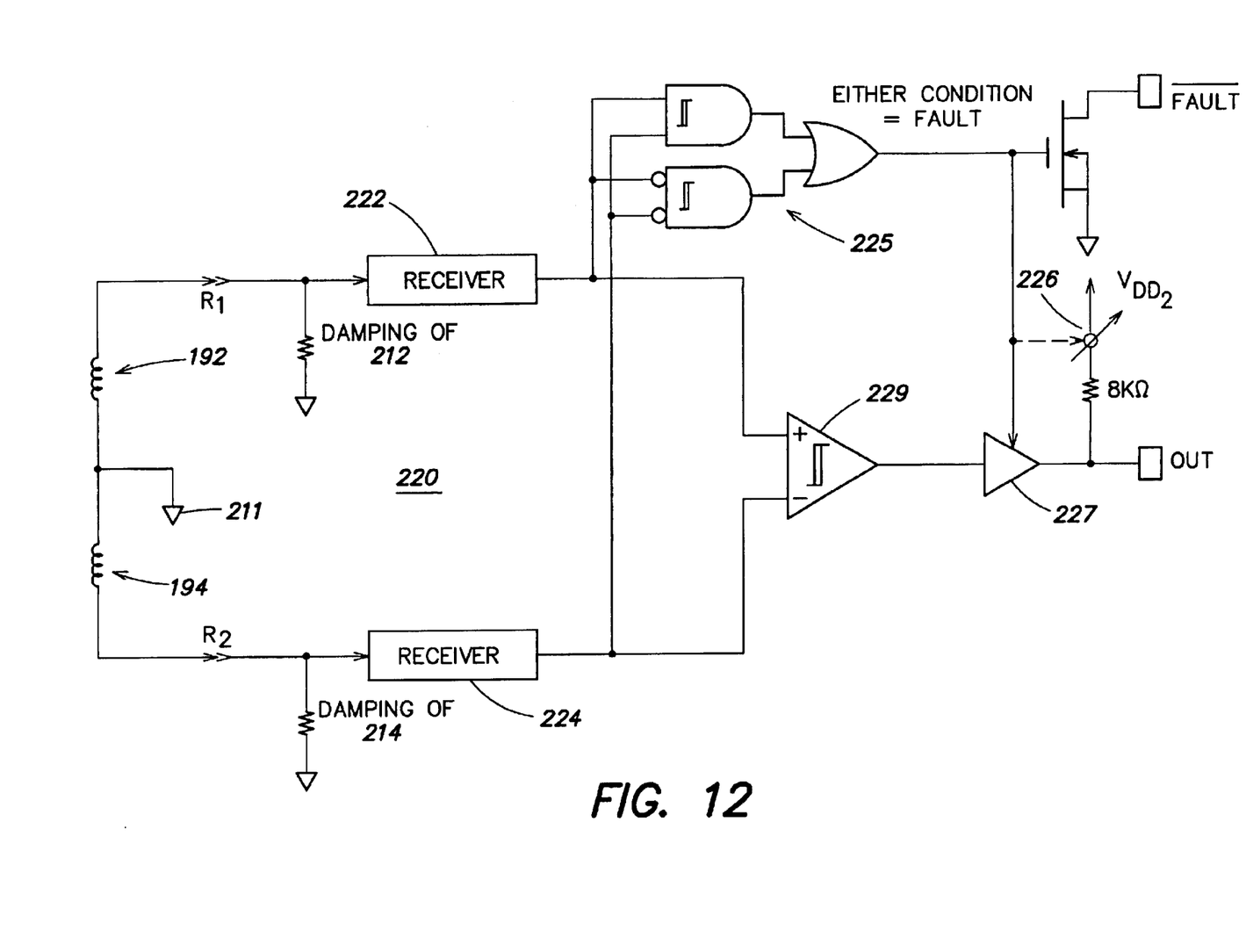

Referring to FIGS. 11 and 12, there is shown a block diagram/diagrammatic illustration for an exemplary coil—coil isolator according to the invention. A driver circuit 172 on a first substrate 174 receives a logic signal input on pad 176 (referenced to an input ground pad 178). In the driver circuit, the input signal drives a Schmidt trigger 182 which, in turn, drives the enable inputs of a first pulse generator 184 and a second pulse generator 186, the former via an inverter 188. Information is coupled from the input side of the isolation barrier to the output side of the isolation barrier in the form of SET and RESET pulses to a differential receiver with hysteresis (not shown) connected to receive the outputs of coil windings 192, 194, which form the secondary windings of a transformer. The pulse generators 184, 186 drive (via wires 196–198) coils 202, 204, respectively, which form the primary windings of the transformer. Coils 202, 204, 192, 194 are formed on (which could include in) a second substrate 206 (which is electrically isolated from the first substrate). Between coils 202, 204 on one hand and coils 192, 194 on the other hand is formed an isolation layer 208 of a dielectric material. Preferably, a Faraday shield 210 also is formed between the primary and secondary windings, with the Faraday shield being connected to a ground 211 which is galvanically isolated from the input ground 178 and which is the reference ground for the output circuits (not shown) driven by coils 192, 194. As shown in FIG. 10, the Faraday shield may be formed over windings 192, 194, the isolation layer 208 is formed over the coils 192, 194 and the coils 202, 204 are formed over the isolation layer.

Switches 212 and 214 effectively short out their respective windings when not transmitting data. An external electromagnetic field would try to couple inductively into the secondary windings but the primary windings appear shorted and thus prevent voltage from being induced in the respective secondary windings. This provides immunity to electromagnetic interference.

The pulse generators create pulses in response to the rising edge or falling edge of the input signal. On the driver side, a watchdog circuit (not shown) preferably monitors the edge activity of the input. If no edges are received for more than one or two microseconds, then a pulse is sent anyway, representing the logical level of the input. The circuitry may be designed such that those pulses do not collide with edge-generated pulses and so that edge-generated pulses take precedence.

An exemplary receiver circuit 220 is shown in FIG. 12. The receiver includes circuits 222 and 224 that monitor the pulses received from the transformer secondaries. If pulses are not received from either one for more than four or five micro-seconds, then through logic 225 the FAULT output is pulled low, the output driver 227 (which buffers a differential comparator 229) goes in to a tri-state (high impedance) condition, and the output is pulled high resisteively via a switch 226. If pulses are received simultaneously from both secondary windings, the assumption is that they are due to common mode noise pickup and they may be ignored.

To reduce the size of the coils needed, instead of a single pulse there may be transmitted a burst of (e.g.,) three to five cycles of a high frequency (e.g., 1.1 GHz) carrier. In this case, the receiver circuits 222 and 224 may rectify the bursts and present that information to a differential comparator.

As another alternative, a continuous carrier may be transmitted via one of the transformers.

The present invention thus may be embodied in a number of ways to provide a signal across an isolation barrier that includes first and second passive components that are galvanically isolated from each other, and formed in such a way using semiconductor processing techniques on silicon with the isolation barrier formed vertically over the substrate. As a result, the devices can be made small enough to fit in an SOIC package.

Note that as used herein the terms first, second, third and fourth may have different meanings, based on context.

Having thus described the invention and various illustrative embodiments of the invention, some of its advantages and optional features, it will be apparent that such embodiments are presented by way of example only and not by way of limitation. Those persons skilled in the art will readily devise alterations and improvements on these embodiments, as well as additional embodiments, without departing from the spirit and scope of the invention. For example, it will be appreciated that although the MR sensor is shown as a bridge circuit in the illustrated embodiments, a single MR element or two MR elements might be employed, instead, and four elements might be arranged in a manner other than as a bridge. Likewise, though two coils are shown as the magnetic field generation members, one might choose to use just one coil, or some other number than two, with appropriate driver circuitry. The driver circuit is not needed in all cases, as the input signal source may be able to drive the coils directly. Alternatively, some other magnetic-field generating apparatus may be employed. Also, the roles of the coils in the all-coil embodiments may be reversed, with the "lower" coils being driven by the input driver circuits and the "upper" coils being the receiving coils on the output side of the isolation barrier and supplying the output signals. Likewise, with a capacitive isolation barrier, the input may drive either the upper or the lower capacitor plates. It is impossible to enumerate all of the variations that will quite quickly occur to those in the art. Accordingly, the invention is limited only as defined in the following claims and equivalents thereto.

What is claimed is:

1. An information signal isolator comprising:
   a first substrate;
   a first passive component formed on the first substrate;
   an isolation layer formed over the first passive component;
   a second passive component formed over the isolation layer
   the first and second passive components being coils;
   an input for receiving an input signal; and
   a driver circuit coupled between the input and one of said passive components.

2. An information isolator comprising:
   a first substrate;
   a first passive component formed on the first substrate;
   an isolation layer formed over the first passive component;
   a second passive component formed over the isolation layer;
   the first and second passive components being capacitor plates;
   an input for receiving an input signal; and
   a driver circuit coupled between the input and one of said passive components.

3. The isolator of claim 1 or claim 2 wherein the first substrate is a semiconductor substrate.

4. The isolator of claim 3, wherein the driver circuit also is formed on the first semiconductor substrate.

5. The isolator of claim 3, further comprising a second substrate, wherein the driver circuit is formed on the second substrate.

6. The isolator of claim 1 or claim 2 wherein the first passive component is formed on top of the first substrate.

7. The isolator of claim 1 or claim 2 wherein the first passive component is formed into the first substrate.

8. The isolator of claim 1 or claim 2 further comprising a third passive component on the substrate, a second isolation layer over the third passive component, and a fourth passive component formed over the second isolation layer, wherein the driver circuit provides signals to the first and third passive components.

9. The isolator of claim 8, wherein the third and fourth passive components are capacitor plates.

10. The isolator of claim 8, wherein the first, second, third, and fourth passive components are coils.

11. The isolator of claim 10 wherein the first and second passive components are referenced to separate, galvanically isolated grounds, and further including a Faraday shield between the first and second passive components, with the Faraday shield referenced to the same ground as the second passive components.

12. The isolator of claim 1 or claim 2, further comprising a third passive component on the substrate, a second isolation layer over the third passive component, and a fourth passive component formed over the second isolation layer, wherein the driver circuit provides signals to the second and fourth passive components.

13. The isolator of claim 12 wherein the first and second isolation layers are a single layer.

14. The isolator of claim 1 wherein the first and second passive components are referenced to separate, galvanically isolated grounds, and further including a Faraday shield between the first and second passive components, with the Faraday shield referenced to the same ground as the second passive components.

* * * * *

(12) INTER PARTES REEXAMINATION CERTIFICATE (0288th)
United States Patent
Haigh et al.

(10) Number: US 6,873,065 C1
(45) Certificate Issued: Aug. 9, 2011

(54) NON-OPTICAL SIGNAL ISOLATOR (75) Inventors: Geoffrey T. Haigh, Boxford, MA (US); Baoxing Chen, Chelmsford, MA (US)

(73) Assignee: Analog Devices, Inc., Norwood, MA (US)

Reexamination Request:
No. 95/000,349, Feb. 20, 2008

Reexamination Certificate for:
Patent No.: 6,873,065
Issued: Mar. 29, 2005
Appl. No.: 09/838,520
Filed: Apr. 19, 2001

Related U.S. Application Data (63) Continuation-in-part of application No. 09/557,542, filed on Apr. 25, 2000, now Pat. No. 6,291,907, which is a continuation of application No. 09/118,032, filed on Jul. 17, 1998, now Pat. No. 6,054,780.

(60) Provisional application No. 60/063,221, filed on Oct. 23, 1997.

(51) Int. Cl.
*H01L 23/58* (2006.01)
*H01L 23/60* (2006.01)
*H01L 23/52* (2006.01)
*H01L 23/522* (2006.01)
*H04B 5/00* (2006.01)

(52) U.S. Cl. .......................... 307/412; 257/351; 307/89
(58) Field of Classification Search ................. 307/412; 257/531
See application file for complete search history.

(56) References Cited

U.S. PATENT DOCUMENTS

| | | | |
|---|---|---|---|
| 4,024,452 A | 5/1977 | Seidel |
| 4,785,345 A | 11/1988 | Rawls |
| 5,469,098 A | 11/1995 | Johnson |
| 5,650,357 A | 7/1997 | Dobkin |
| 5,701,037 A | 12/1997 | Weber |
| 5,781,077 A | 7/1998 | Leitch |

FOREIGN PATENT DOCUMENTS

WO   WO 99/21332   4/1999

OTHER PUBLICATIONS

Knoedl, G., (Jr.), Rawls, S.A., Turgeon, L.J., Bess, J.W. (I.E.E.E.), "A Monolithic Signal Isolator," 1989.

*Primary Examiner*—Albert J Gagliardi (57) ABSTRACT

A non-optical isolator having a driver circuit for providing an input signal to one or more first passive components which are coupled across a galvanic isolation barrier to one or more corresponding second passive components, and an output circuit that converts the signal from the second passive components to an output signal corresponding to the input signal. The entire structure may be formed monolithically as an integrated circuit on one or two die substrates, for low cost, small size, and low power consumption. The passive components may be coils or capacitor plates, for example. When the first and second passive components are capacitor plates, a Faraday shield may be provided between them, with the first and second passive components being referenced to separate grounds and the Faraday shield referenced to the same ground as the second passive components.

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-14 are cancelled.

* * * * *